(12) United States Patent
Niu et al.

(10) Patent No.: US 9,842,735 B2
(45) Date of Patent: Dec. 12, 2017

(54) METHOD OF MANUFACTURING LOW TEMPERATURE POLYCRYSTALLINE SILICON THIN FILM AND THIN FILM TRANSISTOR, THIN FILM TRANSISTOR, DISPLAY PANEL AND DISPLAY DEVICE

(71) Applicant: BOE TECHNOLOGY GROUP CO., LTD., Beijing (CN)

(72) Inventors: Yanan Niu, Beijing (CN); Chao Liu, Beijing (CN); Zengsheng He, Beijing (CN); Lei Chen, Beijing (CN); Yujun Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/908,678

(22) PCT Filed: Jul. 16, 2015

(86) PCT No.: PCT/CN2015/084172
§ 371 (c)(1),
(2) Date: Jan. 29, 2016

(87) PCT Pub. No.: WO2016/138715
PCT Pub. Date: Sep. 9, 2016

(65) Prior Publication Data
US 2017/0004970 A1   Jan. 5, 2017

(30) Foreign Application Priority Data
Mar. 3, 2015 (CN) .......................... 2015 1 0095020

(51) Int. Cl.
*H01L 21/00* (2006.01)
*H01L 21/84* (2006.01)
(Continued)

(52) U.S. Cl.
CPC .. *H01L 21/02675* (2013.01); *H01L 21/02057* (2013.01); *H01L 21/02532* (2013.01);
(Continued)

(58) Field of Classification Search
CPC ......... H01L 21/02; H01L 21/30; H01L 27/12; H01L 29/66; H01L 29/78
(Continued)

(56) References Cited

U.S. PATENT DOCUMENTS 5,936,291 A * 8/1999 Makita .............. H01L 21/28158
257/349
6,090,646 A * 7/2000 Zhang ................. H01L 21/2022
257/E21.133
(Continued)

FOREIGN PATENT DOCUMENTS

CN       1581427 A      2/2005
CN       1979778 A   *  6/2007
(Continued)

OTHER PUBLICATIONS

NPL: English translation of patent CN1979778 A.*
(Continued)

*Primary Examiner* — Sheikh Maruf
(74) *Attorney, Agent, or Firm* — Collard & Roe, P.C.

(57) ABSTRACT

A method of manufacturing a low temperature polycrystalline silicon thin film and a thin film transistor, a thin film transistor, a display panel and a display device are provided. The method includes: forming an amorphous silicon thin film (01) on a substrate (1); forming a pattern of a silicon oxide thin film (02) covering the amorphous silicon thin film (01), a thickness of the silicon oxide thin film (02) located at a preset region being larger than that of the silicon oxide thin film (02) located at other regions; and irradiating the silicon oxide thin film (02) by using excimer laser to allow
(Continued)

the amorphous silicon thin film (01) forming an initial polycrystalline silicon thin film (04), the initial polycrystalline silicon thin film (04) located at the preset region being a target low temperature polycrystalline silicon thin film (05). The polycrystalline silicon thin film has more uniform crystal size.

19 Claims, 5 Drawing Sheets

(51) Int. Cl.
  *H01L 21/02* (2006.01)
  *H01L 29/78* (2006.01)
  *H01L 29/786* (2006.01)
  *H01L 21/308* (2006.01)
  *H01L 27/12* (2006.01)
  *H01L 29/66* (2006.01)

(52) U.S. Cl.
  CPC .. *H01L 21/02592* (2013.01); *H01L 21/02686* (2013.01); *H01L 21/3085* (2013.01); *H01L 21/3086* (2013.01); *H01L 27/1222* (2013.01); *H01L 27/1274* (2013.01); *H01L 29/66757* (2013.01); *H01L 29/786* (2013.01); *H01L 29/78675* (2013.01)

(58) Field of Classification Search
  USPC .... 438/166, 162, 478, 486, 150; 257/43, 63, 257/72, E21.134, E21.413, E29.003, 257/E29.295, E21.09, E21.414, E21.133, 257/E27.111, E21.085
  See application file for complete search history.

(56) References Cited

U.S. PATENT DOCUMENTS

| | | | |
|---|---|---|---|
| 9,209,025 B2 | 12/2015 | Zhang | |
| 2004/0038501 A1 | 2/2004 | Yamada | |
| 2004/0240821 A1* | 12/2004 | Vernon | G02B 6/132 385/130 |
| 2005/0079294 A1 | 4/2005 | Lin et al. | |
| 2008/0079007 A1* | 4/2008 | Morita | H01L 27/1248 257/72 |
| 2010/0051959 A1* | 3/2010 | Moriwaki | H01L 29/42384 257/72 |
| 2010/0301340 A1* | 12/2010 | Shih | H01L 29/78609 257/59 |
| 2011/0081769 A1* | 4/2011 | Takemura | H01L 27/1214 438/463 |
| 2011/0309876 A1* | 12/2011 | Terai | H01L 29/7869 327/534 |
| 2012/0286282 A1* | 11/2012 | Sugawara | H01L 27/1285 257/72 |
| 2013/0075740 A1* | 3/2013 | Correia Fortunato | H01L 21/02565 257/63 |
| 2013/0134431 A1* | 5/2013 | Matsumoto | H01L 21/02532 257/72 |
| 2013/0221360 A1* | 8/2013 | Tsang | H01L 29/78696 257/66 |
| 2015/0034942 A1* | 2/2015 | Kim | H01L 29/7869 257/43 |
| 2016/0126355 A1* | 5/2016 | Shih | H01L 29/7869 257/43 |

FOREIGN PATENT DOCUMENTS

| | | |
|---|---|---|
| CN | 101235534 A | 8/2008 |
| CN | 101359634 A | 2/2009 |
| CN | 103681776 A | 3/2014 |
| CN | 103700695 A | 4/2014 |
| CN | 104538310 A | 4/2015 |
| CN | 104658891 A | 5/2015 |
| JP | H 11-121752 A | 4/1999 |

OTHER PUBLICATIONS

Chinese Office Action in Chinese Application No. 201510095020.6, dated Dec. 28, 2016 with English translation.
International Search Report of PCT/CN2015/084172 in Chinese, dated Dec. 15, 2015 with English translation.
Notice of Transmittal of the International Search Report of PCT/CN2015/084172 in Chinese, dated Dec. 15, 2015.
Written Opinion of the International Searching Authority of PCT/CN2015/084172 in Chinese, dated Dec. 15, 2015 with English translation.
Second Chinese Office Action in Chinese Application No. 201510095020.6, dated Jul. 11, 2017 with English translation.

* cited by examiner

METHOD OF MANUFACTURING LOW TEMPERATURE POLYCRYSTALLINE SILICON THIN FILM AND THIN FILM TRANSISTOR, THIN FILM TRANSISTOR, DISPLAY PANEL AND DISPLAY DEVICE

CROSS REFERENCE TO RELATED APPLICATIONS

This application is the National Stage of PCT/CN2015/084172 filed on Jul. 16, 2015, which claims priority under 35 U.S.C. §119 of Chinese Application No. 201510095020.6 filed on Mar. 3, 2015, the disclosure of which is incorporated by reference.

TECHNICAL FIELD

Embodiments of the present disclosure relate to a method of manufacturing a low temperature polycrystalline silicon thin film and a thin film transistor, a thin film transistor, a display panel and a display device.

BACKGROUND

In pixel units of various display devices, a thin film transistor (TFT), in which a display device is driven by applying a driving voltage, is widely used. The active layer of the TFT are normally made of amorphous silicon (a-Si) material having better stability and processability, but the a-Si material has a small carrier mobility, which cannot satisfy requirements of display devices with a large size and a high resolution, especially cannot satisfy requirements of next generation of active matrix organic light emitting device (AMOLED). Compared to the a-Si thin film transistor, a polycrystalline silicon thin film transistor, especially a low temperature polycrystalline silicon thin film transistor has a larger carrier mobility, a better liquid crystal property and a smaller leakage current, so it has gradually replaced the amorphous silicon thin film transistor, and become the mainly used thin film transistor.

The manufacture process of the polycrystalline silicon thin film transistor may be classified as two types: one type is a high temperature process, wherein the temperature is larger than 600° C. in the manufacture procedures, and the substrate is made of an expensive quartz; the other type is a low temperature process, the temperature is smaller than 600° C. in whole manufacture procedures, and the substrate is made of an inexpensive glass. Therefore, the low temperature polycrystalline silicon (LTPS) technology has gradually replaced the amorphous silicon technology of developing the thin film transistor. In the procedure of manufacturing the low temperature polycrystalline silicon, a challenge of crystallization of polycrystalline silicon is existed as usual.

SUMMARY

Embodiments of the present disclosure provide a low temperature polycrystalline silicon thin film and manufacture method thereof, a thin film transistor and a display device.

According to an embodiment of the present disclosure, a method of manufacturing a low temperature polycrystalline silicon thin film is provided. The manufacturing method includes: forming an amorphous silicon thin film on a substrate; forming a pattern of a silicon oxide thin film covering the amorphous silicon thin film, a thickness of the silicon oxide thin film located at a preset region being larger than that of the silicon oxide thin film located at other regions other than the preset region; and irradiating the silicon oxide thin film by using excimer laser to allow the amorphous silicon thin film to form an initial polycrystalline silicon thin film, the initial polycrystalline silicon thin film located at the preset region being a target low temperature polycrystalline silicon thin film.

In an example, the manufacturing method further includes: after the amorphous silicon thin film forming the initial polycrystalline silicon thin film, removing the silicon oxide thin film on the initial polycrystalline silicon thin film; hydrotreating the initial polycrystalline silicon thin film; and patterning the hydrotreated initial polycrystalline silicon thin film to remain the initial polycrystalline silicon thin film located at the preset region and remove the initial polycrystalline silicon thin film located at other regions other than the preset region so as to obtain the target low temperature polycrystalline silicon thin film.

In an example, the thickness of the silicon oxide thin film located at the preset region is 5 nm~20 nm.

In an example, the thickness of the silicon oxide thin film located at other regions other than the preset region is a half of the thickness of the silicon oxide thin film located at the preset region.

In an example, the manufacturing method further includes: after removing the silicon oxide thin film on the initial polycrystalline silicon thin film and before patterning the hydrotreated initial polycrystalline silicon thin film, smoothing a surface of the initial polycrystalline silicon thin film.

In an example, the silicon oxide thin film is made of silicon dioxide.

In an example, forming of the pattern of the silicon oxide thin film covering the amorphous silicon thin film includes: forming the silicon oxide thin film on the amorphous silicon thin film; coating a layer of photoresist on the silicon oxide thin film; exposing and developing the photoresist layer by using a mask to obtain a completely remained region of the photoresist and a partially remained region of the photoresist, the completely remained region of the photoresist corresponding to the preset region; and etching the completely remained region of the photoresist and the partially remained region of the photoresist to form a pattern of the silicon oxide thin film.

In an example, the manufacturing method further includes: after forming the amorphous silicon thin film and before forming the pattern of the silicon oxide thin film covering the amorphous silicon thin film, hydrotreating and cleaning a surface of the amorphous silicon thin film.

The embodiment of the present disclosure further provides a low temperature polycrystalline silicon thin film, and the low temperature polycrystalline silicon thin film is manufactured by using any one of above manufacturing methods.

The embodiment of the present disclosure further provides a method of manufacturing a thin film transistor. The method includes: forming a pattern of an active layer and a gate electrode insulated from each other on a substrate, and forming a pattern of a source electrode and a drain electrode electrically connected with the active layer, respectively. The active layer is a low temperature polycrystalline silicon thin film, and the low temperature polycrystalline silicon thin film is manufactured by using any one of above manufacturing methods, and the preset region is a region at which the active layer is located.

The embodiment of the present disclosure further provides a thin film transistor. The thin film transistor is manufactured by using the method of manufacturing the thin film transistor.

The embodiment of the present disclosure further provides a display panel including the thin film transistor.

The embodiment of the present disclosure further provides a display device including the display panel provided by embodiments of the present disclosure.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which.

DETAILED DESCRIPTION

Figure 1:
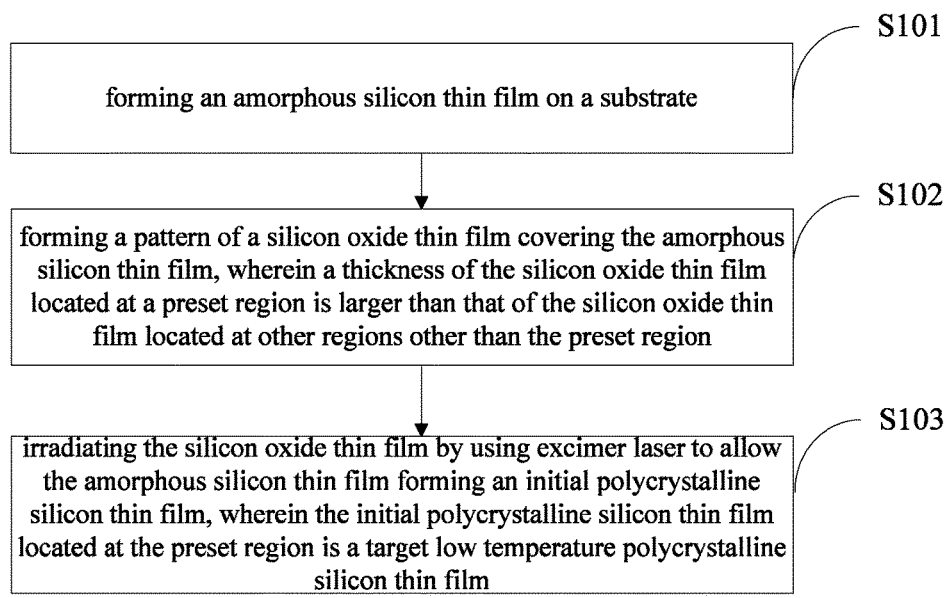
FIG. 1 is a schematic flow chart of a method of manufacturing a low temperature polycrystalline silicon thin film according to an embodiment of the present disclosure.

The technical solutions of the embodiments will be described in a clearly and fully understandable way in connection with the drawings related to the embodiments of the disclosure. It is apparent that the described embodiments are just a part but not all of the embodiments of the disclosure. Based on the described embodiments herein, those skilled in the art can obtain other embodiment(s), without any inventive work, which shall be within the scope of the disclosure.

Unless otherwise defined, all the technical and scientific terms used herein have the same meanings as commonly understood by an ordinary skill in the art to which the present disclosure belongs. The terms, such as "first," "second" or the like, which are used in the description and the claims of the present application, are not intended to indicate any sequence, amount or importance, but for distinguishing various components. Also, the terms, such as "a/an," "one," "the/the" or the like, are not intended to limit the amount, but for indicating the existence of at lease one. The terms, such as "comprise/comprising," "include/including" or the like, are intended to specify that the elements or the objects stated before these terms encompass the elements or the objects and equivalents thereof listed after these terms, but not preclude other elements or objects. The terms, such as "On," "under," or the like, are only used to indicate relative position relationship, and if the position of the object which is described is changed, the relative position relationship may be changed accordingly.

The process of manufacturing a low temperature polycrystalline silicon thin film mainly includes: solid phase crystallization (SPC) technology, metal-induced lateral crystallization (MILC) technology and excimer laser annealing (ELA) technology, or the like. The ELA technology is widely used for crystallization of amorphous silicon (a-Si) due to products having large mobility and high productivity. The excimer laser annealing refers to that high power laser beams are irradiated on a surface of the amorphous silicon thin film to be crystallized; since the silicon has a strong ultraviolet light absorption capacity, the surface of the a-Si thin film can reach more than 1000° C. temperature in very short time (about 50 ns~150 ns) and become a molten state; after the laser pulse is stopped, the amorphous silicon in the molten state is cooled and crystallized into polycrystalline silicon. The polycrystalline silicon thin film manufactured by using the excimer laser annealing technology has advantages of large crystal size, good space selectivity, high doping efficiency, small intracrystalline flaw, good electrical property and high mobility, which is the low temperature polycrystalline silicon thin film having best combination property in current.

The conventional method of manufacturing polycrystalline silicon thin film by using the excimer laser annealing technology may include: depositing a layer of amorphous silicon (a-Si) thin film on a buffer layer, firstly; and after processing a surface of the amorphous silicon thin film, crystallizing the amorphous silicon thin film by using the excimer laser annealing technology to get a low temperature polycrystalline silicon thin film. However, in the procedure of crystallizing the amorphous silicon thin film by using the excimer laser annealing technology, since the crystal size is very sensitive to the laser power and atmosphere environments during the manufacture time, the manufactured polycrystalline silicon thin film has poor uniformity so that there is great difference among the performance of the products including the polycrystalline silicon thin film (e.g. thin film transistors).

The polycrystalline silicon thin film manufactured by using ELA technology has poor uniformity, so it would affect the performance of the products including the polycrystalline silicon thin film.

A method of manufacturing a low temperature polycrystalline silicon thin film, a thin film transistor and a display device provided in embodiments of the present disclosure will be described in detail hereinafter in conjunction with accompanying drawings. The thickness and shape of each of film layers are not depicted in real scale, and is just used to illustratively describe the contents of the present disclosure.

The embodiment of the present disclosure provides a method of manufacturing a low temperature polycrystalline silicon thin film, as shown in FIG. 1. The manufacturing method may include the following steps.

S101, an amorphous silicon thin film is formed on a substrate.

S102, a pattern of a silicon oxide thin film covering the amorphous silicon thin film is formed. A thickness of the silicon oxide thin film located at a preset region is larger than that of the silicon oxide thin film located at other regions other than the preset region.

S103, the silicon oxide thin film is irradiated by using excimer laser so that the amorphous silicon thin film forms an initial polycrystalline silicon thin film. The initial polycrystalline silicon thin film located at the preset region is a target low temperature polycrystalline silicon thin film.

In the above method of manufacturing the low temperature polycrystalline silicon thin film provided in the embodiment of the present disclosure, the amorphous silicon thin film is covered with the silicon oxide thin film, and the thickness of the silicon oxide thin film located at the preset region is larger than that of the silicon oxide thin film located at other regions other than the preset region. When using excimer laser to process the polycrystalline silicon thin film, the silicon oxide thin film is used as a thermal insulating layer so that the temperature of the amorphous silicon thin film is maintained to facilitate the crystallization of the amorphous silicon. The preset region is a region on which the low temperature polycrystalline silicon thin film is formed, the silicon oxide thin film located at the preset region has a larger thickness to maintain the temperature of the amorphous silicon thin film located at the preset region well during the crystallization so that the polycrystalline silicon formed at the preset region has a large crystal size; and the silicon oxide thin film located at other regions other than the preset region has a smaller thickness to avoid the temperature of the amorphous silicon thin film located at other regions being decreased sharply that will make the crystallization environment at boundary of the preset region unstable and affect the uniformity of the crystal size of the polycrystalline silicon formed at boundary of the preset region. Therefore, the above method provided by the embodiment of the present disclosure enable the formed low temperature polycrystalline silicon thin film having larger crystal size, and enable the formed low temperature polycrystalline silicon thin film having good uniformity.

It is noted that in the manufacturing method provided by the embodiment of the present disclosure, the substrate may just be a substrate, and it may be a substrate on which other film layers are formed.

For example, the substrate may refer to a substrate on which a suffer layer is formed.

The manufacturing method may further include: in S103, after forming an initial polycrystalline silicon thin film by using the amorphous silicon thin film, removing the silicon oxide thin film on the initial polycrystalline silicon thin film; hydrotreating the initial polycrystalline silicon thin film; and patterning the hydrotreated initial polycrystalline silicon thin film to remain the initial polycrystalline silicon thin film located at the preset region and remove the initial polycrystalline silicon thin film located at other regions other than the preset region so as to obtain the target low temperature polycrystalline silicon thin film.

For example, in the manufacturing method provided by the embodiment of the present disclosure, the thickness of the silicon oxide thin film located at the preset region is controlled to be in a range of 5 nm~20 nm, or the other values according to actual preparing requirements.

For example, in the manufacturing method provided by the embodiment of the present disclosure, the thickness of the silicon oxide thin film located at other regions other than the preset region is ¼~¾ of the thickness of the silicon oxide thin film located at the preset region. For example, the thickness of the silicon oxide thin film located at other regions other than the preset region is a half of the thickness of the silicon oxide thin film located at the preset region For example, for smoothing a surface of the latterly manufactured low temperature polycrystalline silicon thin film, the manufacturing method may further include: after removing the silicon oxide thin film on the initial polycrystalline silicon thin film and before patterning the hydrotreated initial polycrystalline silicon thin film, smoothing the surface of the initial polycrystalline silicon thin film.

For example, in the manufacturing method provided by the embodiment of the present disclosure, the silicon oxide thin film may be made of silicon dioxide ($SiO_2$).

Figure 2:
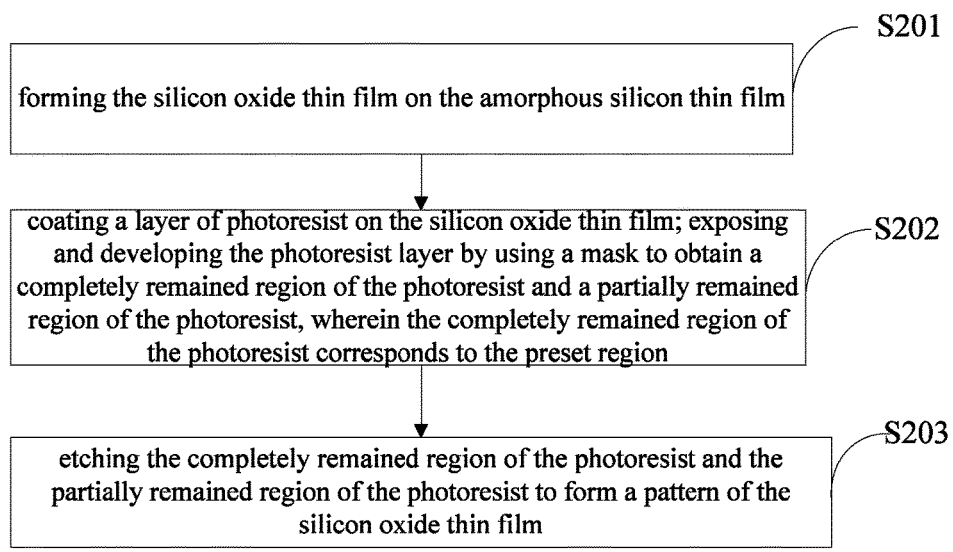
FIG. 2 is a schematic flow chart of forming a pattern of a silicon oxide thin film according to an embodiment of the present disclosure.

For example, in the manufacturing method provided by the embodiment of the present disclosure, as shown in FIG. 2, the step of forming the pattern of the silicon oxide thin film covering the amorphous silicon thin film includes the following steps.

S201, forming the silicon oxide thin film on the amorphous silicon thin film.

S202, coating a layer of photoresist on the silicon oxide thin film; exposing and developing the photoresist layer by using a mask to obtain a completely remained region of the photoresist and a partially remained region of the photoresist, the completely remained region of the photoresist corresponding to the preset region.

S203, etching the completely remained region of the photoresist and the partially remained region of the photoresist to form a pattern of the silicon oxide thin film.

For example, the manufacturing method provided by the embodiment of the present disclosure further includes: after forming the amorphous silicon thin film and before forming the pattern of the silicon oxide thin film covering the amorphous silicon thin film, hydrotreating and cleaning a surface of the amorphous silicon thin film to ensure the quality of the low temperature polycrystalline silicon thin film.

The following describes the manufacturing method provided by the embodiment of the present disclosure through one example. The exemplary method may include the following steps.

Figure 3A:
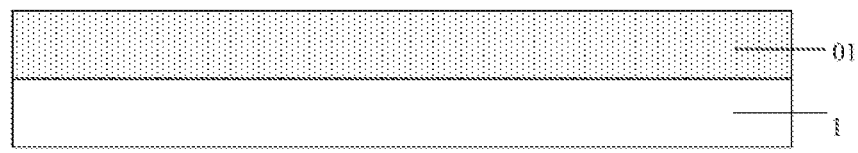
FIGS. 3a-3j show respectively a cross-section structural view of the structures manufactured by implementing steps of the manufacturing method provided by embodiments of the present disclosure.

S301, an amorphous silicon thin film 01 is formed on a substrate 1, as shown in FIG. 3a.

Figure 3B:
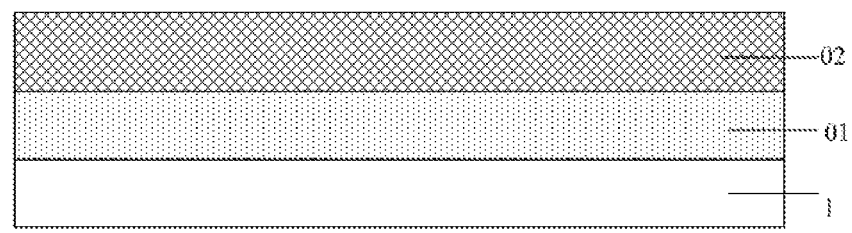

S302, a silicon oxide thin film 02 is formed on the amorphous silicon thin film 01, as shown in FIG. 3b.

For example, a depositing process may be used to form the silicon oxide thin film on the amorphous silicon thin film.

The silicon oxide thin film may be made of silicon dioxide ($SiO_2$), and the thickness of the silicon oxide thin film is 5 nm~20 nm.

For example, for ensuring the quality of the low temperature polycrystalline silicon thin film, after step S301 and before step S302, a surface of the amorphous silicon thin film is hydrotreated and cleaned.

Figure 3C:
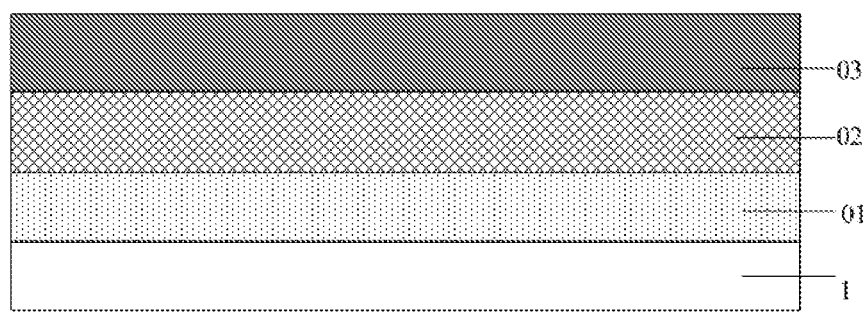

S303, a layer of photoresist 03 is coated on the silicon oxide thin film 02, as shown in FIG. 3c.

For example, the photoresist layer 03 may be positive photoresist, or may be negative photoresist.

Figure 3D:
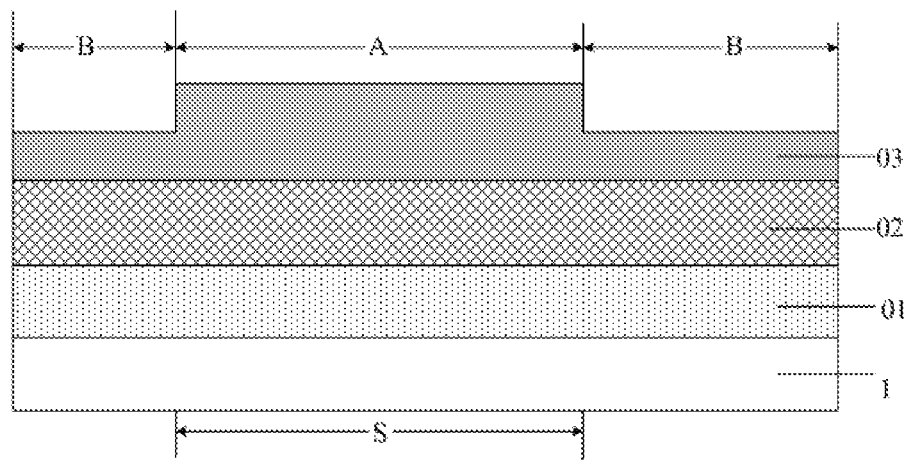

S304, the photoresist layer 03 is exposed and developed by using a mask to obtain a completely remained region A of the photoresist and a partially remained region B of the photoresist. The completely remained region A of the photoresist corresponds to the preset region S, as shown in FIG. 3d.

Figure 3E:
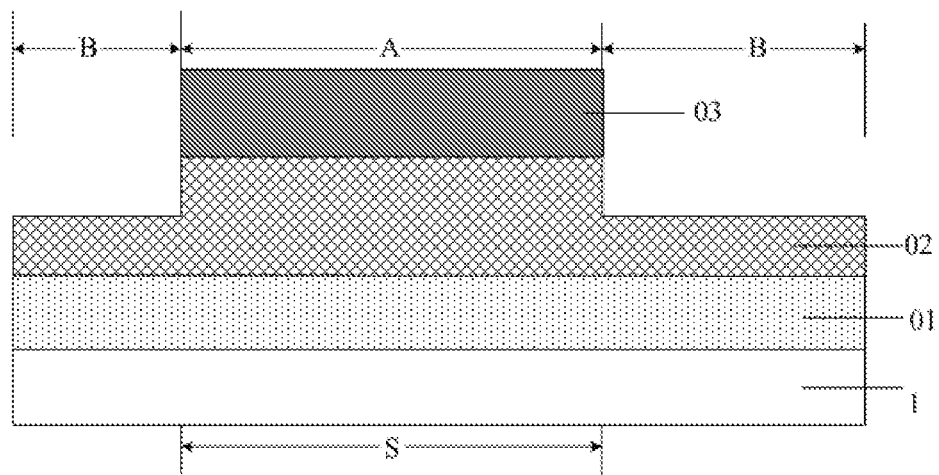

S305, the completely remained region A of the photoresist and the partially remained region B of the photoresist are etched by a same thickness until the thickness of the silicon oxide thin film 02 located at the partially remained region B of the photoresist is a half of the thickness of the silicon oxide thin film 02 located at the completely remained region A of the photoresist, to obtain the silicon oxide thin film 02 having the residual photoresist layer 03 on the completely remained region A of the photoresist, as shown in FIG. 3e.

Figure 3F:
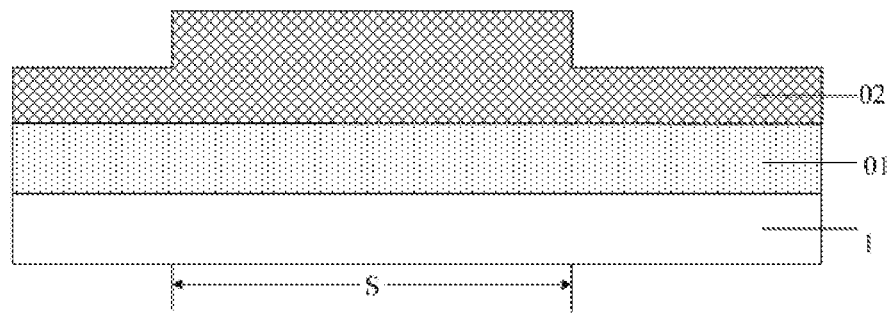

S306, the residual photoresist layer 03 on the silicon oxide thin film 02 is removed to obtain a pattern of the silicon oxide thin film 02, as shown in FIG. 3f.

Figure 3G:
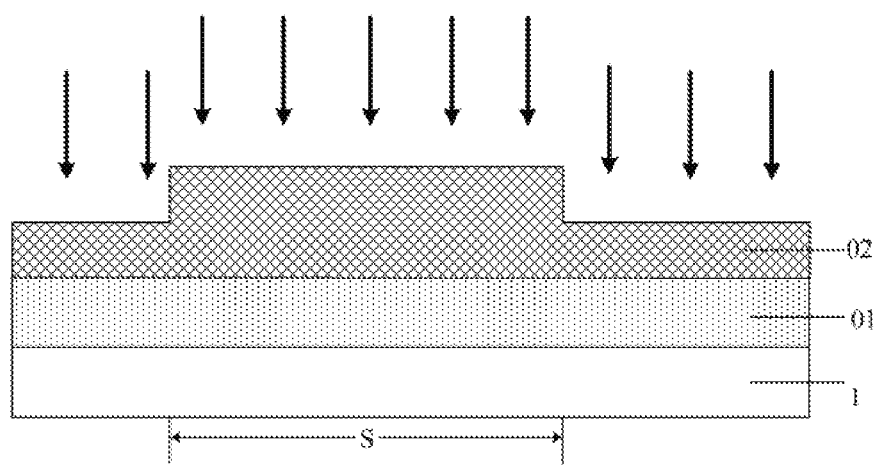
Figure 3H:
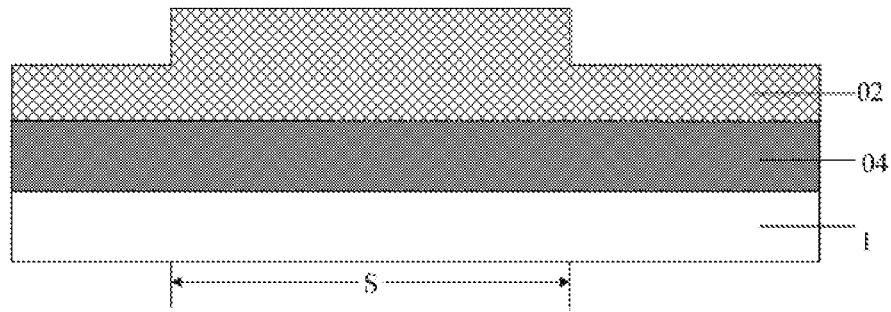

S307, the silicon oxide thin film 02 is irradiated by using excimer laser so that the amorphous silicon thin film 01 forms the initial polycrystalline silicon thin film 04, as shown in FIGS. 3g and 3h. The FIG. 3g shows a structural diagram at the beginning of the laser irradiating, and the FIG. 3h shows a structural diagram of the formed initial polycrystalline silicon thin film 04.

Figure 3I:
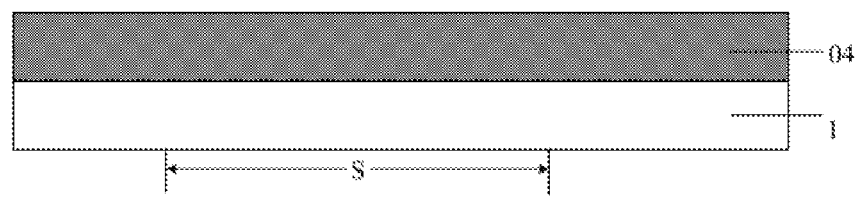

S308, the silicon oxide thin film 02 on the initial polycrystalline silicon thin film 04 is removed; and the initial polycrystalline silicon thin film is hydrotreated, as shown in FIG. 3i.

Figure 3J:
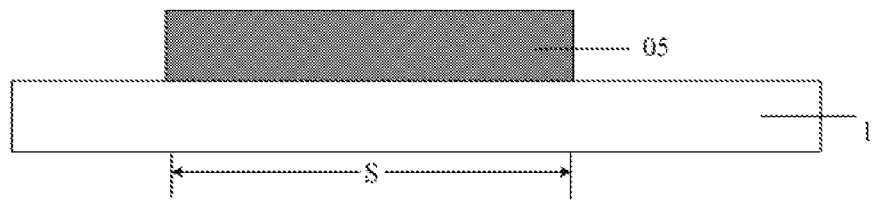

S309, the hydrotreated initial polycrystalline silicon thin film 04 is patterned to remain the initial polycrystalline silicon thin film 04 located at the preset region S and remove the initial polycrystalline silicon thin film 04 located at other regions other than the preset region S so as to obtain the target low temperature polycrystalline silicon thin film 05, as shown in FIG. 3j.

Through the above steps S301-S309 in the above embodiment, a target low temperature polycrystalline silicon thin film is formed at the preset region. In the manufacturing procedure, the amorphous silicon thin film is covered with the silicon oxide thin film, and the thickness of the silicon oxide thin film located at the preset region is larger than that of the silicon oxide thin film located at other regions other than the preset region, when using excimer laser to process the polycrystalline silicon thin film, the silicon oxide thin film is used as a thermal insulating layer so that the temperature of the amorphous silicon thin film is maintained to facilitate the crystallization of the amorphous silicon. The preset region is a region on which the low temperature polycrystalline silicon thin film is formed, the silicon oxide thin film located at the preset region has a larger thickness to maintain the temperature of the amorphous silicon thin film located at the preset region well during the crystallization so that the polycrystalline silicon formed at the preset region has a large crystal size; and the silicon oxide thin film located at other regions other than the preset region has a smaller thickness to avoid the temperature of the amorphous silicon thin film located at other regions being decreased sharply that will make the crystallization environment at boundary of the preset region unstable and affect the uniformity of the crystal size of the polycrystalline silicon formed at boundary of the preset region. Therefore, the above method provided by the embodiment of the present disclosure can enable the formed low temperature polycrystalline silicon thin film having large crystal size, and enable the formed low temperature polycrystalline silicon thin film having good uniformity.

Based on a same inventive concept, the present disclosure also provides a low temperature polycrystalline silicon thin film. The low temperature polycrystalline silicon thin film is prepared by any of above manufacturing methods provided by embodiments of the present disclosure. The low temperature polycrystalline silicon thin film has large crystal size and good uniformity.

Based on a same inventive concept, the present disclosure also provides a method of manufacturing a thin film transistor. The method includes: forming a pattern of an active layer and a gate electrode insulated from each other on a substrate, and forming a pattern of a source electrode and a drain electrode electrically connected with the active layer, respectively. The active layer is a low temperature polycrystalline silicon thin film, and the low temperature polycrystalline silicon thin film is prepared by using any of above manufacturing methods, and the preset region is a region at which the active layer is located. The method of manufacturing the thin film transistor uses similar principle for solving problems as the above method of manufacturing the low temperature polycrystalline silicon thin film, the implementation of the method of manufacturing the thin film transistor can refer to the implementations of the above method of manufacturing the low temperature polycrystalline silicon thin film, which is not repeated herein.

Based on a same inventive concept, the present disclosure also provides a thin film transistor. The thin film transistor is manufactured by using the method of manufacturing the thin film transistor, and the low temperature polycrystalline silicon thin film has large crystal size and good uniformity.

Based on a same inventive concept, the present disclosure also provides a display panel including the thin film transistor provided by the embodiment of the present disclosure. For example, the thin film transistor may act as a switch component to control pixels, or act as a driving component to drive pixels.

Based on a same inventive concept, the present disclosure further provides a display device including the display panel provided by embodiments of the present disclosure. The display device may include: a liquid crystal display panel, an electronic paper, an organic light emitting diode (OLED) panel, a mobile phone, a tablet personal computer, a television, a display, a notebook computer, a digital photo frame, a navigator or any product or component having display function.

The display device is applicable in various types of display-like device including a liquid crystal display panel, an organic electroluminescent display, an inorganic electroluminescent display, an active matrix/organic light emitting diode (AMOLED) or the like.

The embodiment of the present disclosure provide a method of manufacturing the low temperature polycrystalline silicon thin film, a thin film transistor and a display device. The amorphous silicon thin film is covered with the silicon oxide thin film, and the thickness of the silicon oxide thin film located at the preset region is larger than that of the silicon oxide thin film located at other regions other than the preset region, when excimer laser is used to process the polycrystalline silicon thin film, the silicon oxide thin film is used as a thermal insulating layer so that the temperature of the amorphous silicon thin film is maintained to facilitate the crystallization of the amorphous silicon. The preset region is a region on which the low temperature polycrystalline silicon thin film is formed, the silicon oxide thin film located at the preset region has larger thickness to maintain the temperature of the amorphous silicon thin film located at the preset region well during the crystallization so that the polycrystalline silicon formed at the preset region has larger crystal size; and the silicon oxide thin film located at other regions other than the preset region has a smaller thickness to avoid the temperature of the amorphous silicon thin film located at other regions being decreased sharply that will make the crystallization environment at boundary of the preset region unstable and affect the uniformity of the crystal size of the polycrystalline silicon formed at boundary of the preset region. Therefore, the above method provided by the embodiment of the present disclosure enable the formed low temperature polycrystalline silicon thin film having large crystal size, and enable the formed low temperature polycrystalline silicon thin film having good uniformity.

The described above are only illustrative implementations of the present disclosure, and the present disclosure is not limited thereto. For one of ordinary skill in the art, various modifications and improvements may be readily contemplated without departing from the spirit and scope of the present disclosure, and all of which shall fall within the protection scope of the present disclosure. The scope protected by the present disclosure is defined by the claims.

The present application claims priority of Chinese patent application No. 201510095020.6 filed on Mar. 3, 2015 and entitled "METHOD OF MANUFACTURING LOW TEMPERATURE POLYCRYSTALLINE SILICON THIN FILM AND THIN FILM TRANSISTOR, THIN FILM TRANSIS- TOR, DISPLAY PANEL AND DISPLAY DEVICE", the entire contents of which are incorporated herein by reference.

What is claimed is:

1. A method of manufacturing a low temperature polycrystalline silicon thin film, comprising:
   forming an amorphous silicon thin film on a substrate;
   forming a pattern of a silicon oxide thin film covering the amorphous silicon thin film, wherein a thickness of the silicon oxide thin film located at a preset region is larger than that of the silicon oxide thin film located at other regions other than the preset region;
   irradiating the silicon oxide thin film by using excimer laser to allow the amorphous silicon thin film forming an initial polycrystalline silicon thin film, wherein the initial polycrystalline silicon thin film located at the preset region is a target low temperature polycrystalline silicon thin film;
   after forming the initial polycrystalline silicon thin film by using the amorphous silicon thin film, removing the silicon oxide thin film on the initial polycrystalline silicon thin film;
   hydrotreating the initial polycrystalline silicon thin film; and
   patterning the hydrotreated initial polycrystalline silicon thin film to remain the initial polycrystalline silicon thin film located at the preset region and remove the initial polycrystalline silicon thin film located at other regions other than the preset region so as to obtain the target low temperature polycrystalline silicon thin film.

2. The manufacturing method according to claim 1, wherein the thickness of the silicon oxide thin film located at the preset region is 5 nm~20 nm.

3. The manufacturing method according to claim 2, wherein the thickness of the silicon oxide thin film located at other regions other than the preset region is a half of the thickness of the silicon oxide thin film located at the preset region.

4. The manufacturing method according to claim 1, further comprising: after removing the silicon oxide thin film on the initial polycrystalline silicon thin film and before patterning the hydrotreated initial polycrystalline silicon thin film,
   smoothing a surface of the initial polycrystalline silicon thin film.

5. The manufacturing method according to claim 1, wherein the silicon oxide thin film is made of silicon dioxide.

6. A method of manufacturing a low temperature polycrystalline silicon thin film, comprising:
   forming an amorphous silicon thin film on a substrate;
   forming a silicon oxide thin film on the amorphous silicon thin film;
   applying a layer of photoresist on the silicon oxide thin film; exposing and developing the photoresist layer by using a mask to obtain a completely remained region of the photoresist and a partially remained region of the photoresist, wherein the completely remained region of the photoresist corresponds to the preset region;
   etching the completely remained region of the photoresist and the partially remained region of the photoresist to form a pattern of the silicon oxide thin film; and
   irradiating the silicon oxide thin film by using excimer laser to allow the amorphous silicon thin film forming an initial polycrystalline silicon thin film, wherein the initial polycrystalline silicon thin film located at the preset region is a target low temperature polycrystalline silicon thin film.

7. The manufacturing method according to claim 1, further comprising: after forming the amorphous silicon thin film and before forming the pattern of the silicon oxide thin film covering the amorphous silicon thin film,
   hydrotreating and cleaning a surface of the amorphous silicon thin film.

8. A low temperature polycrystalline silicon thin film, wherein the low temperature polycrystalline silicon thin film is prepared by using the manufacturing method according to claim 1.

9. A method of manufacturing a thin film transistor, comprising:
   forming an active layer by:
      forming an amorphous silicon thin film on a substrate;
      forming a pattern of a silicon oxide thin film covering the amorphous silicon thin film, wherein a thickness of the silicon oxide thin film located at a preset region is larger than that of the silicon oxide thin film located at other regions other than the preset region; and
      irradiating the silicon oxide thin film by using excimer laser to allow the amorphous silicon thin film forming an initial polycrystalline silicon thin film, wherein the initial polycrystalline silicon thin film located at the preset region is a target low temperature polycrystalline silicon thin film; and
   forming a pattern of the active layer and a gate electrode insulated from each other on the substrate, and forming a pattern of a source electrode and a drain electrode electrically connected with the active layer, respectively; wherein the active layer is a low temperature polycrystalline silicon thin film.

10. A thin film transistor, wherein the thin film transistor is prepared by the manufacturing method according to claim 9.

11. A display panel, comprising the thin film transistor according to claim 10.

12. A display device, comprising the display panel according to claim 11.

13. The manufacturing method according to claim 9, wherein the thickness of the silicon oxide thin film located at the preset region is 5 nm~20 nm.

14. The manufacturing method according to claim 9, wherein the thickness of the silicon oxide thin film located at other regions other than the preset region is a half of the thickness of the silicon oxide thin film located at the preset region.

15. The manufacturing method according to claim 9, further comprising: after removing the silicon oxide thin film on the initial polycrystalline silicon thin film and before patterning the hydrotreated initial polycrystalline silicon thin film,
   smoothing a surface of the initial polycrystalline silicon thin film.

16. The manufacturing method according to claim 2, further comprising: after removing the silicon oxide thin film on the initial polycrystalline silicon thin film and before patterning the hydrotreated initial polycrystalline silicon thin film,
   smoothing a surface of the initial polycrystalline silicon thin film.

17. The manufacturing method according to claim 3, further comprising: after removing the silicon oxide thin film on the initial polycrystalline silicon thin film and before patterning the hydrotreated initial polycrystalline silicon thin film, smoothing a surface of the initial polycrystalline silicon thin film.

18. The manufacturing method according to claim 9, wherein the forming the pattern of the silicon oxide thin film covering the amorphous silicon thin film comprises:

forming the silicon oxide thin film on the amorphous silicon thin film;

applying a layer of photoresist on the silicon oxide thin film; exposing and developing the photoresist layer by using a mask to obtain a completely remained region of the photoresist and a partially remained region of the photoresist, wherein the completely remained region of the photoresist corresponds to the preset region; and etching the completely remained region of the photoresist and the partially remained region of the photoresist to form a pattern of the silicon oxide thin film.

19. The manufacturing method according to claim 9, further comprising: after forming the amorphous silicon thin film and before forming the pattern of the silicon oxide thin film covering the amorphous silicon thin film, hydrotreating and cleaning a surface of the amorphous silicon thin film.

* * * * *